(12) United States Patent
Nakano

(10) Patent No.: US 8,610,284 B2
(45) Date of Patent: Dec. 17, 2013

(54) SEMICONDUCTOR DEVICE AND ELECTRONIC DEVICE

(75) Inventor: Takahiro Nakano, Kyoto (JP)

(73) Assignee: Panasonic Corporation, Osaka (JP)

( * ) Notice: Subject to any disclaimer, the term of this patent is extended or adjusted under 35 U.S.C. 154(b) by 66 days.

(21) Appl. No.: 13/032,859

(22) Filed: Feb. 23, 2011

(65) Prior Publication Data
US 2011/0140282 A1 Jun. 16, 2011

Related U.S. Application Data

(63) Continuation of application No. PCT/JP2009/005956, filed on Nov. 9, 2009.

(30) Foreign Application Priority Data

Nov. 10, 2008 (JP) ................. 2008-288109

(51) Int. Cl.
H01L 23/48 (2006.01)
H01L 21/66 (2006.01)

(52) U.S. Cl.
USPC ............. 257/774; 257/621; 257/E23.011; 257/E23.174; 257/E21.53; 438/16

(58) Field of Classification Search
USPC ............. 257/621, 774, E23.011, E23.174, 257/E21.53; 438/16
See application file for complete search history.

(56) References Cited

U.S. PATENT DOCUMENTS

| | | | |
|---|---|---|---|
| 2002/0019069 A1* | 2/2002 | Wada | 438/69 |
| 2004/0080013 A1 | 4/2004 | Kimura et al. | |
| 2004/0080040 A1 | 4/2004 | Dotta et al. | |
| 2004/0130640 A1 | 7/2004 | Fujimori | |
| 2006/0231928 A1 | 10/2006 | Dotta et al. | |
| 2006/0249737 A1 | 11/2006 | Fujimori | |
| 2007/0235882 A1* | 10/2007 | Sekiguchi et al. | 257/777 |
| 2007/0290300 A1* | 12/2007 | Kawakami | 257/621 |
| 2008/0042227 A1 | 2/2008 | Asano et al. | |
| 2008/0128848 A1 | 6/2008 | Suzuki et al. | |
| 2009/0039471 A1* | 2/2009 | Katagiri | 257/620 |
| 2010/0155928 A1* | 6/2010 | Taguchi et al. | 257/692 |

FOREIGN PATENT DOCUMENTS

| | | |
|---|---|---|
| JP | 3-230579 | 10/1991 |
| JP | 2003-060115 | 2/2003 |
| JP | 2004-152810 | 5/2004 |
| JP | 2004-152811 | 5/2004 |
| JP | 2004-207461 | 7/2004 |
| JP | 2007-123909 | 5/2007 |
| JP | 2008-140819 | 6/2008 |
| JP | 2008-270650 | 11/2008 |

* cited by examiner

Primary Examiner — Peniel M Gumedzoe
(74) Attorney, Agent, or Firm — Panasonic Patent Center (57) ABSTRACT

A semiconductor device includes: a semiconductor substrate, first and second internal electrodes provided on a surface of the semiconductor substrate; a first through electrode which penetrates through the semiconductor substrate in a thickness direction and is electrically connected to the first internal electrode; and a second through electrode connected to the second internal electrode, and the second internal electrode is thinner than the first internal electrode. The second through electrode may penetrate through the second internal electrode.

24 Claims, 7 Drawing Sheets

FIG. 1

Prior Art

SEMICONDUCTOR DEVICE AND ELECTRONIC DEVICE

CROSS REFERENCE TO RELATED APPLICATIONS

This is a continuation application of PCT application No. PCT/JP2009/005956 filed on Nov. 9, 2009, designating the United States of America.

BACKGROUND OF THE INVENTION (1) Field of the Invention

The present invention relates to a semiconductor device and a manufacturing method of the same.

(2) Description of the Related Art

In recent electronic devices, a number of semiconductor devices using a wafer level chip size package (CSP) method that is an assembly process performed during a wafer state have been used in order to achieve further reduction in size, thickness, and weight as well as higher-density packaging of an electronic device.

For example, a solid-state imaging device that is a representative optical device is used as a light-receiving sensor in a digital imaging device such as a digital still camera, a cell phone camera, and a digital video camera. To realize further reduction in size, thickness, and weight as well as higher-density packaging of imaging devices in recent years, a wafer level CSP method has been adopted that is a method for securing electrical connection inside and outside a device by forming a through electrode and rewiring during assembly at a wafer level before singulation, instead of the forming and rewiring during ceramic-type or plastic-type packaging in which the electrical connection inside and outside the device is secured by die bonding or wire bonding (for example, see Japanese Unexamined Patent Application Publication 2004-207461 and Japanese Unexamined Patent Application Publication 2007-123909).

Figure 1:
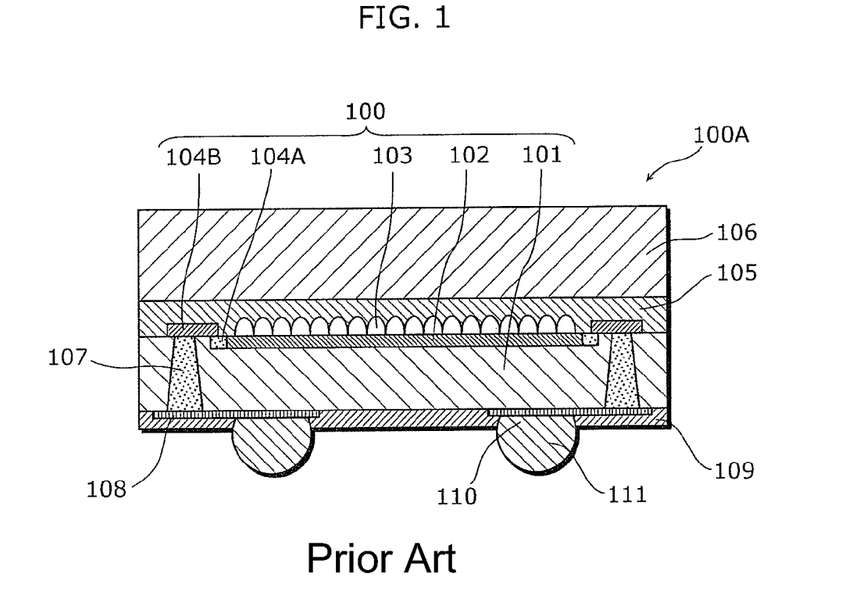
FIG. 1 is a cross-sectional view showing a configuration of a conventional solid-state imaging device.

FIG. 1 is a cross-sectional view of a solid-state imaging device having a conventional wafer level CSP configuration.

As shown in FIG. 1, a conventional solid-state imaging device 100A includes: an imaging area 102 formed on a semiconductor substrate 101 and having a main surface which is a light-receiving surface of the semiconductor substrate 101 and on which a plurality of microlenses 103 are provided; a peripheral circuit area 104A formed in a perimeter region of the imaging area 102 on the main surface; and a solid-state imaging element 100 including a plurality of electrode portions 104B connected to the peripheral circuit area 104A.

In addition, on a main-surface side of the semiconductor substrate 101, a transparent substrate 106 formed of, for example, optical glass is formed via an adhesive material 105 made primarily of resin. Furthermore, inside the semiconductor substrate 101, a through electrode 107 penetrating through the semiconductor substrate 101 in a thickness direction is formed.

In the back surface opposite to the main surface of the semiconductor substrate 101, metal wiring 108 connected to the plurality of electrode portions 104B that are connected to the peripheral circuit area 104A is formed via the through electrode 107, and an insulating resin layer 109 is formed to have an aperture 110 which covers a portion of the metal wiring 108 and exposes the other portion of the metal wiring 108. In the aperture 110, an external electrode 111 made of, for example, a solder material is formed.

Note that the solid-state imaging element 100 is electrically insulated from the through electrode 107 and the metal wiring 108 by an insulation layer not shown in the figure.

As described above, in the conventional solid-state imaging device 100A, the plurality of electrode portions 104B are electrically connected to the metal wiring 108 via the through electrode 107, and furthermore are electrically connected to an external electrode 111 via the metal wiring 108, thus allowing extraction of the light reception signal.

The conventional solid-state imaging device 100A described above is manufactured by the following processing, for example.

(Process 1) First, a plurality of the solid-state imaging elements 100 having the configuration described above are formed on the wafer according to a well-known method. To the wafer on which the plurality of solid-state imaging elements 100 are formed, the transparent substrate 106 having the same shape as the wafer and made of, for example, optical glass and so on is attached via the adhesive material 105 made primarily of a resin layer.

(Process 2) Next, a through hole, which penetrates through the semiconductor substrate from a back side and exposes the plurality of electrode portions 104B connected to the peripheral circuit area 104A, is formed using dry etching, wet etching, or the like. Subsequently, by embedding a conductive material in the through hole, the through electrode 107 to be connected to the plurality of electrode portions 104B which extracts light reception signal is formed.

(Process 3) Next, by electrolytic plating, the metal wiring 108 to be electrically connected to the through electrode 107 is formed on the back surface of the solid-state imaging element 100.

(Process 4) Next, on the back surface of the solid-state imaging element 100, the insulating resin layer 109 is formed to cover the metal wiring 108. Generally, the insulating resin layer 109 is formed using a photosensitive resin, by spin coating or attaching dry film.

(Process 5) Subsequently, by selectively removing the insulating resin layer 109, using a photolithography technique (exposure and development), the aperture 110 exposing a portion of the metal wiring 108 is formed.

(Process 6) Subsequently, in the aperture 110, by solder ball placement or solder paste printing using flux, an external electrode 111 is formed of, for example, a solder material, and is to be electrically connected to the metal wiring 108.

(Process 7) Lastly, the wafer is singulated into a plurality of solid-state imaging devices 100A as shown in FIG. 1, by cutting the solid-state imaging element 100, the adhesive material 105, the transparent substrate 106, and the insulating resin layer 109 all at once, using a cutting tool, for example, a dicing saw.

SUMMARY OF THE INVENTION

In the conventional solid-state imaging device described above, a through electrode is formed by forming, by etching or the like, a through hole which penetrates through the semiconductor substrate from the back side and exposes a plurality of internal electrodes, and then embedding a conductive material in the through hole. In other words, the through electrode is electrically connected to the back side of the internal electrode, without penetrating through the internal electrode.

Thus, electrical testing is the only effective method for recognizing and testing whether or not an electrical connection between the through electrode and each internal electrode is ensured (presence or absence of connection failure).

Generally, it is not easy to electrically test an unfinished wafer in the middle of the process because such testing requires another step of temporarily removing the wafer from the processing line and performing probe testing on the wafer. This makes it difficult to detect the connection failure between the through electrode and each internal electrode in an earlier stage of the process.

It is further difficult to check and control whether or not a state and appearance of the formed through hole and through electrode is appropriate. Specifically, by electrical testing, it is not possible to check and control: whether or not the through hole is formed to reliably reach the back surface of the internal electrode; whether or not a size (diameter) of the through hole at the back surface of the internal electrodes satisfies a desired value; and whether or not the formed through electrode has a shape suited to be electrically connected to the internal electrode.

As described above, in case of a connection failure occurring between the through electrode and internal electrode, and in case of a failure in forming of the through hole or through electrode, such failure cannot be detected earlier, and thus it is more likely to cause quality degradation and production loss.

An object of the present invention, which is conceived in view of such conditions, is to provide a technique that allows: easy recognition of the state and appearance of the formed through hole and through electrode; improvement in qualities of the through hole and through electrode; and earlier detection of the connection failure.

To achieve the above object, a semiconductor device according to an aspect of the present invention includes: a substrate; a first internal electrode and a second internal electrode that are provided on a first main surface of the substrate; a first through electrode penetrating through the substrate in a thickness direction to reach the first internal electrode and electrically connected to the first internal electrode; a second through electrode penetrating through the second internal electrode in the thickness direction; and a wiring provided on a second main surface and electrically connected to the first through electrode, the second main surface being opposite to the first main surface of the substrate.

Here, it is preferable that the second internal electrode be thinner than the first internal electrode, and the first internal electrode may be formed of a plurality of metal films that are laminated, and the second internal electrode may be formed of a single metal film.

In addition, it is preferable that the second internal electrode not be electrically connected to the substrate. In addition, when a function circuit is formed on the first main surface of the substrate, it is preferable that the second internal electrode not be electrically connected to the function circuit.

In addition, the semiconductor device may further include a protection film covering the second internal electrode.

The semiconductor device may further include a third through electrode penetrating through the substrate in the thickness direction to reach a portion which is part of the first main surface of the substrate and on which no internal electrode is provided.

Here, it is preferable that the third through electrode not be electrically connected to the substrate. In addition, when a function circuit is formed on the first main surface of the substrate, it is preferable that the third through electrode not be electrically connected to the function circuit.

In addition, the semiconductor device may further include a protection film covering the portion that the third through electrode reaches and is part of the first main surface of the substrate.

The semiconductor device may further include an insulation layer covering the second main surface excluding a portion of the wiring. In addition, the semiconductor device may further include an external electrode provided in the portion of the wiring that is not covered by the insulation layer, and electrically connected to the wiring.

In addition, a semiconductor device according to another aspect of the present invention may include: a substrate; an internal electrode provided on a first main surface of the substrate; a first through electrode penetrating through the substrate in a thickness direction to reach the internal electrode and electrically connected to the internal electrode; a third through electrode penetrating through the substrate in the thickness direction to reach a portion which is part of the first main surface of the substrate and on which no internal electrode is provided; and a wiring provided on a second main surface and electrically connected to the first through electrode, the second main surface being opposite to the first main surface of the substrate.

In addition, a method of manufacturing a semiconductor device according to an aspect of the present invention includes: providing, on a first main surface of a substrate, a first internal electrode and a second internal electrode that is thinner than the first internal electrode; forming a first through hole that penetrates through the substrate in a thickness direction to reach the first internal electrode; forming a second through hole that penetrates through the substrate in the thickness direction; providing, on an inner wall of the first through hole, a first through electrode electrically connected to the first internal electrode; providing, on an inner wall of the second through hole, a second through electrode electrically connected to the second internal electrode; and providing, on a second main surface, a wiring electrically connected to the first through electrode, the second main surface being opposite to the first main surface of the substrate.

Here, the second through hole may be formed to penetrate through the second substrate and the second internal electrode in the thickness direction.

Here, it is preferable that the forming of the first through hole and the forming of the second through hole be performed at the same time.

In addition, the method of manufacturing a semiconductor device may further include forming a third through hole that penetrates through the substrate in the thickness direction to reach a portion which is part of the first main surface of the substrate and on which no internal electrode is provided, and the method may further include providing a third through electrode on an inner wall of the third through hole.

Here, it is preferable that the forming of the first through hole, the forming of the second through hole, and the forming of the third through hole be performed at the same time.

In addition, the method of manufacturing a semiconductor device may further include providing an insulation layer that covers the second main surface excluding a portion of the wiring, and the method may further include providing, in the portion of the wiring that is not covered by the insulation layer, an external electrode electrically connected to the wiring.

In addition, the method of manufacturing a semiconductor device may further include performing appearance check from a side of the first main surface of the substrate, on at least one of the second through hole, the third through hole, the second through electrode, and the third through electrode, and estimating, according to a result of the appearance check, whether the first through hole is properly formed.

In addition, a method of manufacturing a semiconductor device according to another aspect of the present invention may include: providing an internal electrode on a first main surface of a substrate; forming a first through hole that penetrates through the substrate in a thickness direction to reach the internal electrode; forming a third through hole that penetrates through the substrate in the thickness direction to reach a portion which is part of the first main surface of the substrate and on which no internal electrode is provided; and providing, on an inner wall of the first through hole, a first through electrode electrically connected to the internal electrode; providing a third through electrode on an inner wall of the third through hole; and providing, on a second main surface, a wiring electrically connected to the first through electrode, the second main surface being opposite to the first main surface of the substrate.

The present invention can be realized not only as such a semiconductor device and a method of manufacturing the semiconductor device but also as an electronic device including a wiring or an external electrode of such a semiconductor device electrically connected to a wiring provided on the surface of the circuit board.

As described above, the semiconductor device according to an implementation of the present invention includes the first through electrode which penetrates through the substrate in a thickness direction to reach the first internal electrode. In addition, the semiconductor device according to an implementation of the present invention includes at least one of: the second through electrode penetrating through the substrate and the second internal electrode in the thickness direction, and the third through electrode penetrating through the substrate in the thickness direction to reach a portion which is part of the surface of the substrate and on which no internal electrode is provided.

In practice, the first through electrode is used to connect the inside and outside of the semiconductor device, but it is not possible to check, by appearance from the surface side of the substrate, the state and appearance of the formed first through electrode and through hole that is previously formed to provide the first through electrode, because the first through electrode and through hole are hidden behind the first internal electrode.

In contrast, it is possible to easily perform, from the surface side of the substrate, appearance check (appearance inspection, size measurement, and so on) on the state and appearance of the formed second through electrode, third through electrode, and through hole that is previously formed to provide these through electrodes, thus making it possible to estimate, according to the result of the appearance check, the state and appearance of the formed first through electrode and through hole that is formed in advance of forming the first through electrode.

Unlike electrical testing, since such estimation based on appearance check can be performed, in an earlier stage of the manufacturing process, on the state and appearance of the formed first electrode and through hole that is formed in advance of forming the first through electrode, it is possible to reduce production loss by process control, such as immediately performing rework processing or terminating the subsequent process when the estimated state and appearance as a result of the formation is not satisfactory. In addition, by immediately feeding back the result of the appearance check to the conditions for manufacturing the subsequent substrate or lot, it is possible to improve qualities of the through hole and the through electrode, and increase a manufacturing yield of the semiconductor device.

FURTHER INFORMATION ABOUT TECHNICAL BACKGROUND TO THIS APPLICATION

The disclosure of Japanese Patent Application No. 2008-288109 filed on Nov. 10, 2008, including specification, drawings and claims is incorporated herein by reference in its entirety.

The disclosure of PCT application No. PCT/JP2009/05956 filed on Nov. 9, 2009, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3(a) to (c) is an enlarged cross-sectional view showing an example of a configuration of a main part of the semiconductor device according to an embodiment of the present invention;

FIG. 6(a) to (c) is an enlarged cross-sectional view showing an example of a configuration of the main part of the semiconductor device at the end of Process 2 according to an embodiment of the present invention; and FIG. 7(a) to (c) is an enlarged cross-sectional view showing an example of a configuration of the main part of the semiconductor device at the end of Process 4 according to an embodiment of the present invention.

DESCRIPTION OF THE PREFERRED EMBODIMENT

Hereinafter, a semiconductor device according to an embodiment of the present invention will be described.

(Structure of the Semiconductor Device)

First, the structure of the semiconductor device according to an embodiment of the present invention will be described with reference to the drawings.

(Configuration of Main Part)

Figure 2:
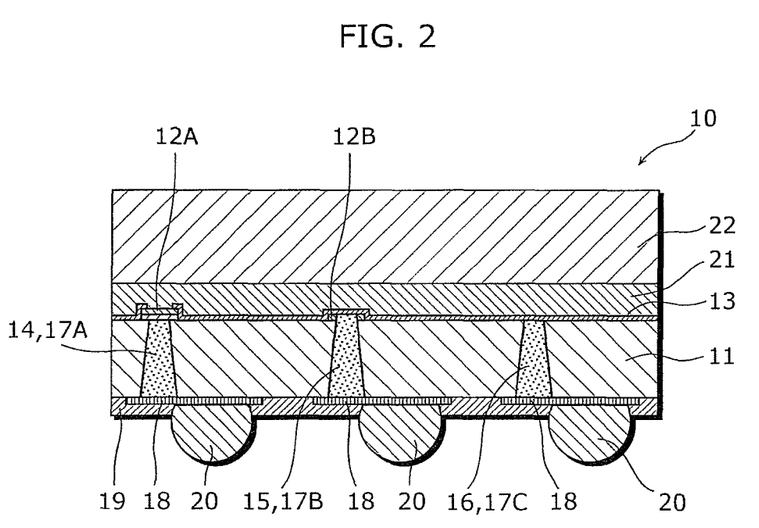
FIG. 2 is a cross-sectional view showing an example of a configuration of a semiconductor device according to an embodiment of the present invention.

FIG. 2 is a cross-sectional view showing a structure of a semiconductor device 10 according to an embodiment of the present invention.

The semiconductor device 10 according to an embodiment of the present invention includes, as shown in FIG. 2: an internal electrode 12A and an internal electrode 12B that are made primarily of a metal such as Al or Cu and provided on a main surface shown in an upper part of the figure (hereinafter, referred to as a surface) of a semiconductor substrate 11; a first through electrode 17A penetrating through the semiconductor substrate 11 in a thickness direction to reach a main surface shown in a lower part of the figure (hereinafter, referred to as a back surface) of the internal electrode 12A; a second through electrode 17B penetrating through the semiconductor substrate 11 and the internal electrode 12B in the thickness direction; a third through electrode 17C penetrating through the semiconductor substrate 11 to reach a portion which is part of the surface of the semiconductor substrate 11 and on which neither of the internal electrodes 12A and 12B is provided; and metal wiring 18 formed on the back surface of the semiconductor substrate 11 and electrically connected to each of the first through electrode 17A, the second through electrode 17B, and the third through electrode 17C.

Here, the semiconductor substrate 11 and the metal wiring 18 are examples, respectively, of the substrate and wiring according to the present invention.

The thickness of the semiconductor substrate 11 (that is, a depth of a first through hole 14, a second through hole 15, and a third through hole 16) is, as a general example, 10 μm to 300 μm.

In the semiconductor substrate 11, the first through hole 14, the second through hole 15, and the third through hole 16 are previously provided, and the first through electrode 17A, the second through electrode 17B, and the third through electrode 17C are formed by plating, for example, with Cu or a metal material primarily composed of Cu, inner walls of the first through hole 14, the second through hole 15, and the third through hole 16 (that is, a surface that is of each of the semiconductor substrate 11, the internal electrode 12A, and the internal electrode 12B and is inwardly oriented toward a corresponding one of the first through hole 14, the second through hole 15, and the third through whole 16).

As shown in FIG. 2, the first through electrode 17A, the second through electrode 17B, and the third through electrode 17C may be formed to fill in the first through hole 14, the second through hole 15, and the third through hole 16, respectively, or may be formed into a form of metal film (not shown) that covers, with an approximately constant thickness, a surface that is of the semiconductor substrate 11 and is inwardly oriented toward each of the first through hole 14, the second through hole 15, and the third through hole 16.

In addition, the metal wiring 18 is formed by plating the back surface of the semiconductor substrate 11 with, for example, Cu or a metal material primarily composed of Cu. Preferably, the thickness of the metal wiring 18 is 5 μm to 20 μm.

Note that in order to insulate, from the semiconductor substrate 11, each of the first through electrode 17A, the second through electrode 17B, the third through electrode 17C, and the metal wiring 18, an insulation film including SiO$_2$ and so on (not shown) may be provided on the back surface of the semiconductor substrate 11 as well as on a surface that is of the semiconductor device 11 and is inwardly oriented toward each of the first through hole 14, the second through hole 15, and the third through hole 16 before performing plating using a metal material which is to be formed into the first through electrode 17A, the second through electrode 17B, the third through electrode 17C, and the metal wiring 18.

(Structure to Protect and Reinforce the Semiconductor Device)

Furthermore, on the surface side of the semiconductor substrate 11, a transparent substrate 22 formed primarily of, for example, optical glass, support glass, and so on is formed via a protection film 13 and an adhesive layer 21.

The protection film 13 is generally called passivation, and made of an inorganic material such as SiN.

The adhesive layer 21 may be formed to cover the surfaces of the semiconductor substrate 11 and the protection film 13, and may also have a cavity structure which includes a hollow under the transparent substrate 22.

The structure and material of each of the adhesive layer 21 and the transparent substrate 22 is appropriately selected according to the purpose, such as improving electrical characteristics of the semiconductor substrate 11 or reinforcing strength of the semiconductor substrate 11.

Note that the transparent substrate 22 is particularly effective when mainly applying a semiconductor device according to the present invention to an optical device, and when applying the semiconductor device as an reinforcing plate intended to reinforce the strength of the semiconductor substrate 11, but the transparent substrate 22 is not an essential constituent element for an ultimate structure in every case but may be or may not be included depending on the intended use.

(Structure of the Semiconductor Device for Internal and External Connections)

Furthermore, the insulation layer 19 is provided which covers, excluding a portion of the metal wiring, the back surface of the semiconductor substrate 11, and an external electrode 20 to be electrically connected to the metal wiring 18 is formed using, for example, a lead-free solder material having a Sn—Ag—Cu composition, on the portion that is not covered by the insulation layer 19 of the metal wiring 18.

Thus, each of the internal electrodes 12A and 12B is electrically connected to the external electrode 20 corresponding to each of the internal electrodes 12A and 12B via the first through electrode 17A, the second through electrode 17B, and the metal wiring 18.

In addition, on the surface of the semiconductor substrate 11, a function circuit (not shown) is formed which performs a function of the semiconductor device 10, and the internal electrode 12A is electrically connected to the function circuit. This allows reception and transmission of an electrical signal in and out the semiconductor device 10 via the internal electrode 12A, the first through electrode 17A, the metal wiring 18, and the external electrode 20.

Here, it is preferable that the internal electrode 12B should not be electrically connected to the function circuit of the semiconductor device 10. In addition, an internal electrode to be connected to the third through electrode 17C is not provided. In such a structure, since the second through electrode 17B and the third through electrode 17C are not electrically connected to the function circuit, the internal electrode 12B, the second through electrode 17B, and the third through electrode 17C has no negative electrical effect on the function circuit unit. In this case, the external electrode 20 corresponding to each of the second through electrode 17B and the third through electrode 17C can be utilized to obtain mechanical strength that is required for attachment of the semiconductor substrate 10 to the circuit board of an electronic device.

Figure 3:
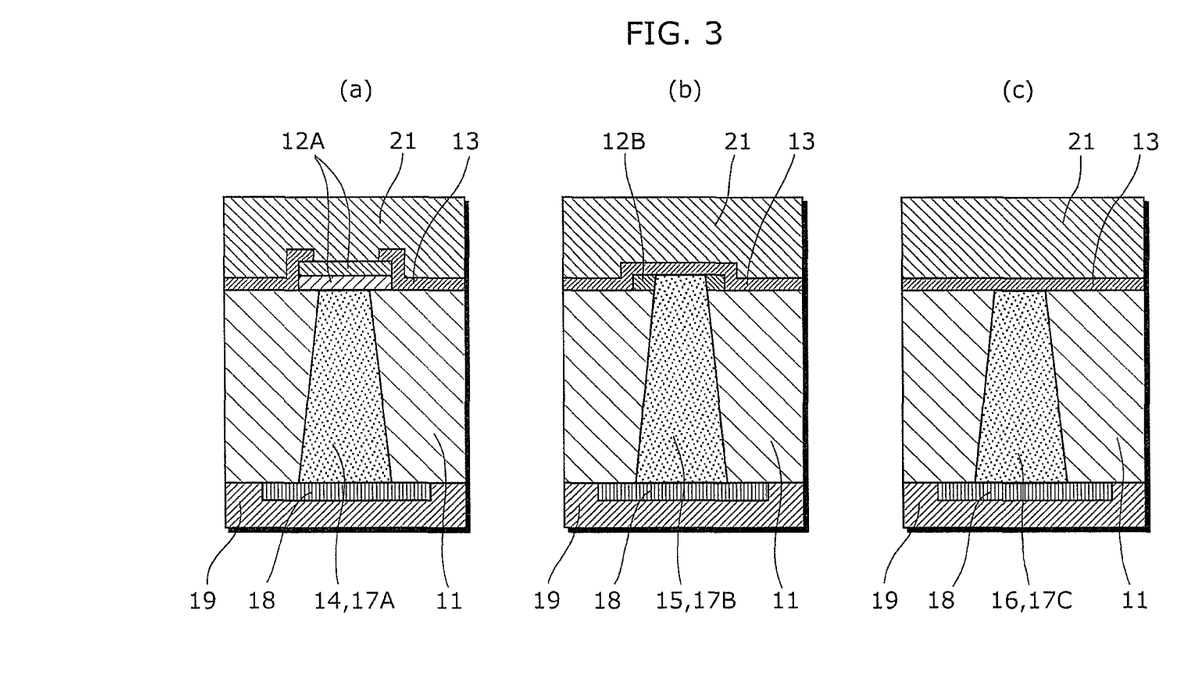

(Detailed Structure of the Main Part)

FIG. 3(a) to (c) is an enlarged cross-sectional view showing a detailed structure of a main part of the semiconductor device 10 according to an embodiment of the present invention. A detailed form of the main part of the semiconductor device 10 will be described using FIG. 3(a) to (c).

As shown in FIG. 3(a), the first through hole 14 for providing the first through electrode 17A is formed to penetrate through the semiconductor substrate 11 to reach the back surface of the internal electrode 12A.

As shown in FIG. 3(b), the second through hole 15 for providing the second through electrode 17B is formed to penetrate through the semiconductor substrate 11 and the internal electrode 12B.

As shown in FIG. 3(c), the third through hole 16 for providing the third through electrode 17C is formed to penetrate through the semiconductor substrate 11 to reach the portion which is part of the surface of the semiconductor substrate 11 and on which no internal electrode is provided.

As described earlier, the first through electrode 17A, the second through electrode 17B, and the third through electrode 17C are formed by filling in, with a metal material, the first through hole 14, the second through hole 15, and the third through hole 16, respectively, that are formed on the semiconductor substrate 11. In addition, the first through electrode 17A, the second through electrode 17B, and the third through electrode 17C may be formed by providing the metal material in a film state on inner walls of the first through hole 14, the second through hole 15, and the third through hole 16.

Here, it is preferable that the internal electrode 12B be thinner than the internal electrode 12A. To provide thickness difference, the internal electrode 12A may be formed by laminating a plurality of metal films in layers, and the internal electrode 12B may be formed of a single layer of metal film.

By providing the thickness difference between the internal electrodes 12A and 12B, even when the first through hole 14 and the second through hole 15 are formed at the same time, the first through hole 14 is formed to reach the back surface of the internal electrode 12A, and the second through hole 15 is formed to penetrate through the internal electrode 12B.

In addition, the protection film 13 is provided excluding a portion of the surface of the internal electrode 12A. The portion of the internal electrode, which is not covered by the protection film 13, is normally used for probe testing. In contrast, the protection film 13 is formed to completely cover each of the surface of the internal electrode 12B and the portion that the third through hole 16 reaches and is part of the surface of the semiconductor substrate 11.

By providing the protection film 13 in such a form, it is possible to prevent, from being exposed on the surface of the semiconductor substrate 11, a reaction product which is generated during forming of the second through hole 15 and a reaction product which is generated during forming of the third through hole 16. Furthermore, it is also possible to prevent the second through electrode 17B and the third through electrode 17C from being exposed on the surface of the semiconductor substrate 11.

In such a configuration, it is possible to determine whether or not the second through hole 15 and the third through hole 16 have reached the surface of the internal electrode 12B, and when they reach the surface of the internal electrode 12B, it is possible to easily perform appearance check (appearance inspection, size measurement, and so on) on the size (diameter) at the surface of the internal electrode 12B, from the surface side of the semiconductor substrate 11.

Furthermore, it is possible to easily check, by appearance, the state or appearance of the formed second through electrode 17B and third through electrode 17C from the surface side of the semiconductor substrate 11.

According to the result of such appearance check, it is possible to estimate the state or appearance of the formed first through hole 14 and first through electrode 17A that are hidden behind the internal electrode 12A and thus cannot be checked by appearance.

For example, from the presence or absence, and from the size (diameter) of the second through hole 15 and the third through hole 16 as viewed from the surface side of the semiconductor substrate 11, it is possible to estimate whether or not the first through hole 14 reliably reaches the back surface of the internal electrode 12A, or whether or not the first through hole 14 satisfies a desired size (diameter) at the back surface of the internal electrode 12A.

In addition, for example, from the state and appearance of the formed second through electrode 17B and third through electrode 17C as viewed from the surface side of the semiconductor substrate 11, it is possible to estimate whether or not the first through electrode 17A having a desired contact area (connection resistance) with the internal electrode 12A is formed.

Such estimation can be easily performed based on the appearance check, thus allowing a process control such as determining whether to continue or terminate the subsequent process in an earlier stage of the manufacturing processing, and immediately feeding back the result of the appearance check to the conditions for manufacturing the subsequent semiconductor substrate or the lot.

Note that the second through electrode 17B and the third through electrode 17C may be omitted.

Such a configuration is effective in the case of, for example, a highly-controllable manufacturing process of the through hole, which allows securing the desired quality of the first through electrode 17A without checking the second through electrode 17B and the third through electrode 17C by appearance.

Furthermore, one of the second through hole 15 and the third through hole 16 may be omitted. In this case, it is also possible to check the state and appearance of the formed first through hole 14, using the other one of the second through hole 15 and the third through hole 16 that is not omitted.

Figure 4:
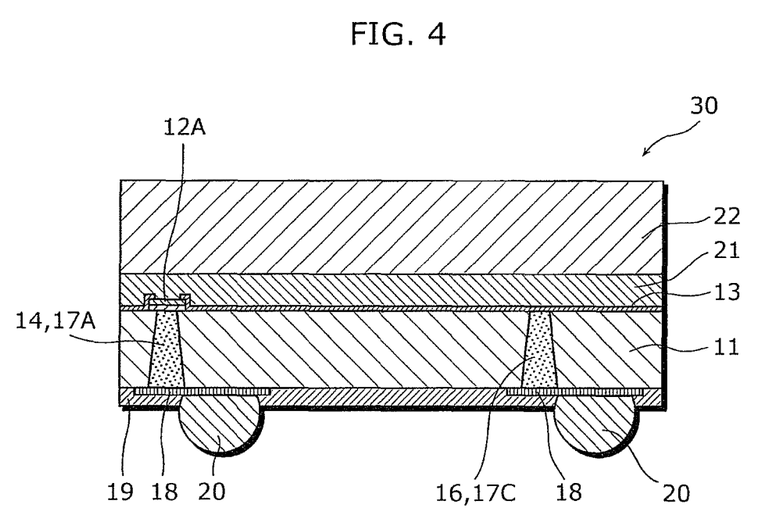
FIG. 4 is a cross-sectional view showing an example of a configuration of a semiconductor device according to an embodiment of the present invention.

In other words, on the semiconductor substrate 11, all of the first through hole 14, the second through hole 15, the third through hole 16 may be formed, or only the first through hole 14 and the second through hole 15 may be formed, or only the first through hole 14 and the third through hole 16 may be formed.

FIG. 4 is a cross-sectional view showing a configuration of the semiconductor device 30 in which: of the first, second, and third through holes 14, 15, and 16, only the first through hole 14 and the third through hole 16 are formed on the semiconductor substrate 11. In the semiconductor device 30, compared to the semiconductor device 10 shown in FIG. 2, a constituent element related to the second through hole 15 is omitted.

In addition, when each of the second through hole 15 and the third through hole 16 is formed at least one for one wafer, the second through hole 15 and the third through hole 16 can be used for estimating the state and appearance of the formed first through hole 14. In addition, by setting, as a process control target in one wafer, approximately three to ten semiconductor devices to be subsequently singulated, and the second through hole 15 and third through hole 16 may be formed only in such semiconductor devices 10.

(Manufacturing Method of the Semiconductor Device)

Figure 5:
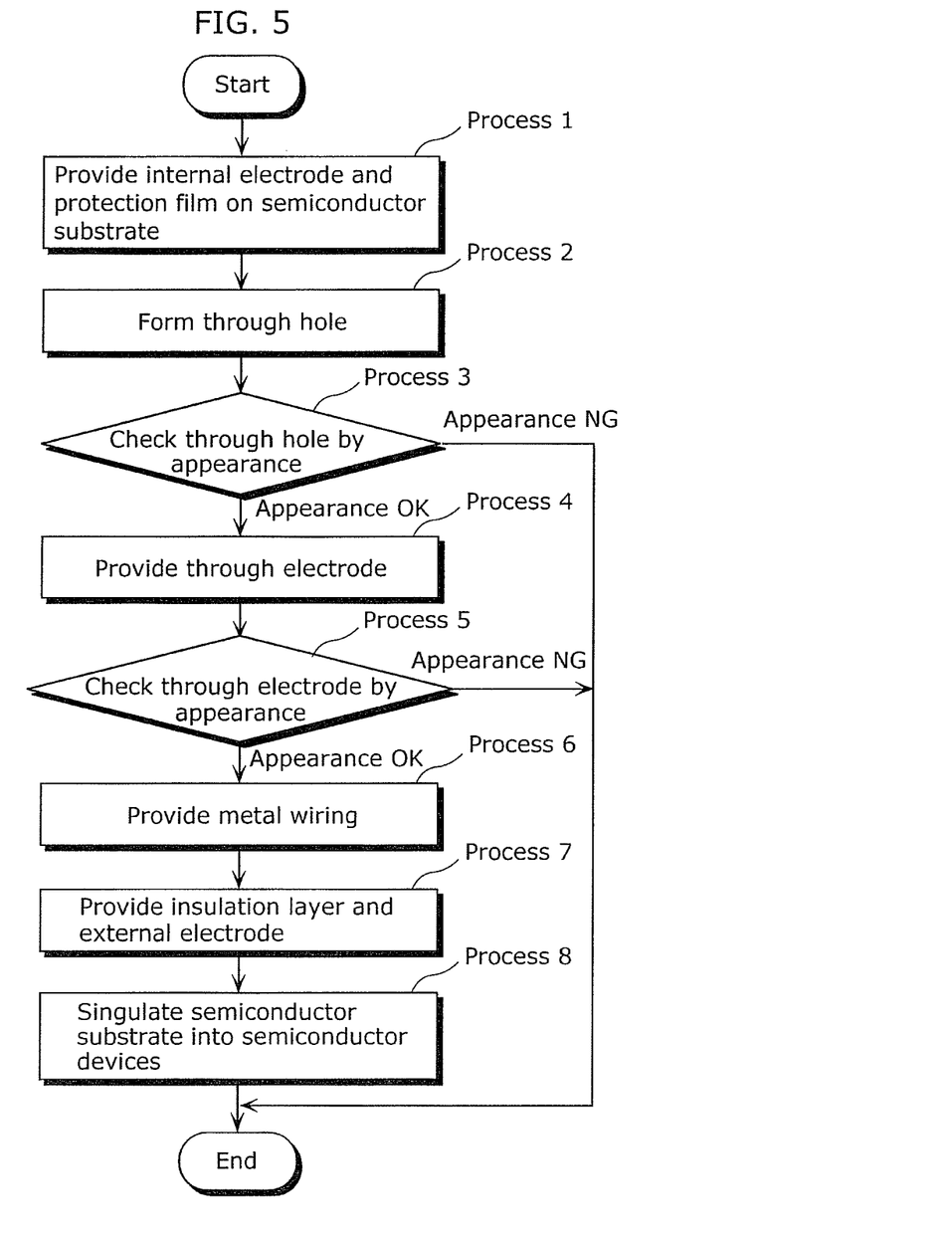
FIG. 5 is a flowchart showing an example of a method of manufacturing a semiconductor device according to an embodiment of the present invention.

The following will describe a method of manufacturing the semiconductor device 10 according to an embodiment of the present invention. Here described is a characteristic method of processing and testing the semiconductor substrate 11 that is to be performed in the manufacturing method of the semiconductor device 10.

FIG. 5 is a flowchart showing an example of a method of manufacturing the semiconductor device 10. In the following description, the main part of the semiconductor device 10 will be referenced using the reference signs shown in FIG. 2.

Note that a manufacturing method that omits the processing related to the internal electrode 12B, the second through hole 15, and the second through electrode 17B from the manufacturing method described below is applicable to the semiconductor device 30 shown in FIG. 4.

(Process 1) By processing the wafer that is the semiconductor substrate 11 according to the known method, the function circuit not shown and the internal electrodes 12A and 12B formed primarily of a metal such as Al or Cu are formed on the surface of the semiconductor substrate 11, and furthermore the protection film 13 is formed to cover the surfaces of the semiconductor substrate 11, and the internal electrodes 12A and 12B. Subsequently, for probe testing, the protection film 13 may be removed at a portion of the surface of the internal electrode 12A.

Here, it is preferable that the internal electrode 12B be formed to be thinner than the internal electrode 12A.

Note that in this process, the function circuit, the internal electrode 12A, the internal electrode 12B, and the protection film 13 are provided for each of the plurality of the semiconductor devices 10 on a wafer that are to be singulated later.

Subsequently, backgrinding is performed on the wafer that is the semiconductor substrate 11 up to a desired thickness (generally 10 μm to 30 μm), and mirror processing such as chemical mechanical planarization (CMP) is further performed.

(Process 2) From the back side of the semiconductor substrate 11, the first through hole 14, the second through hole 15, and the third through hole 16 are formed using dry etching, wet etching, or the like.

Here, in man-hour and cost reduction perspectives, it is desirable that the first through hole 14, the second through hole 15, and the third through hole 16 be formed at the same time. By forming the internal electrode 12B that is thinner than the internal electrode 12A, even when the first through hole 14 and the second through hole 15 are formed at the same time, it is possible to form the first through hole 14 to reach the back surface of the internal electrode 12A, and to form the second through hole 15 to penetrate through the internal electrode 12B.

Figure 6:
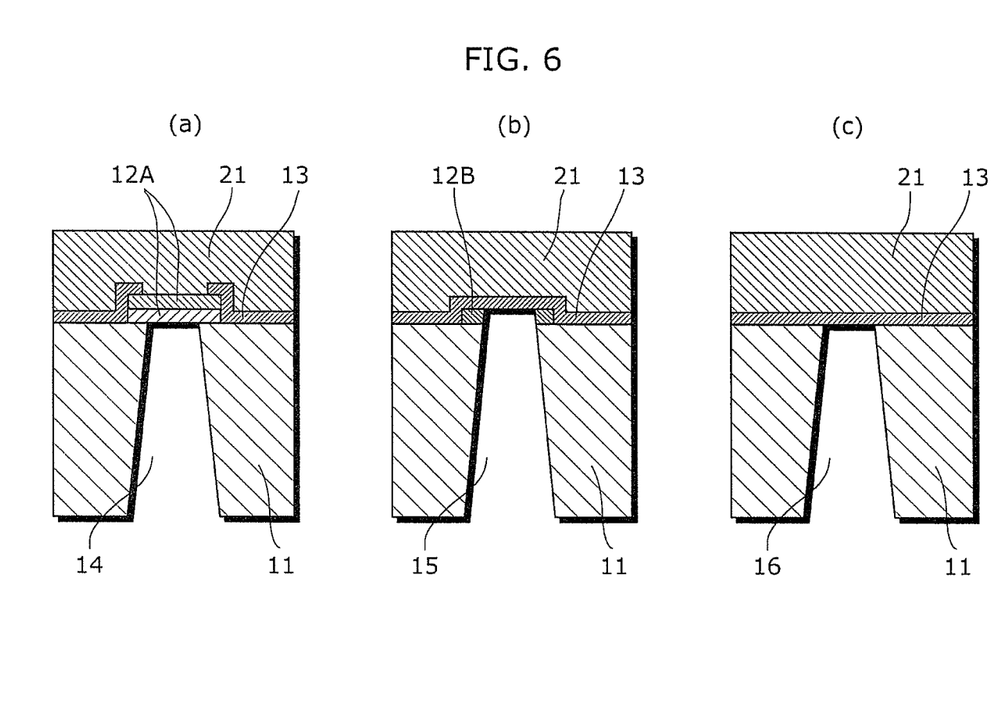

Note that the third through hole 16 is formed to penetrate through the semiconductor substrate 11.

FIG. 6(a) to (c) is an enlarged cross-sectional view showing a configuration of the main part of the semiconductor device 10 at the end of Process 2. FIG. 6(a) to (c) corresponds to the portions shown in FIG. 3(a) to (c), each showing an example of a state in which each of the first through hole 14, the second through hole 15, and the third through hole 16 is formed.

(Process 3) From the surface side of the semiconductor substrate 11, for example, through observation using a microscope, appearance check (appearance inspection, size measurement, and so on) is performed on the presence or absence and the size (diameter) of the second through hole 15 that appears on the surface of the internal electrode 12B and the third through hole 16 that appears on the surface of the semiconductor substrate 11.

As a result of the appearance check, when the second through hole 15 and the third through hole 16 cannot be checked or are smaller than a desired size, rework processing is performed (not shown in FIG. 5) or the subsequent process is terminated, based on an estimation that the first through hole 14 is not properly formed accordingly (that is, the first through electrode 17A is not properly formed in the subsequent Process 4). This allows reducing production loss.

In addiction, the result of the appearance check may be immediately fed back to the conditions for manufacturing the through hole in the subsequent substrate or lot. This allows improving quality of the through hole and increasing manufacturing yield.

(Process 4) Using a chemical vapor deposition (CVD) method, a print-fill method, and so on, an insulation layer formed of $SiO_2$ or the like, which is not shown in FIG. 2, is formed on an entire back surface of the semiconductor substrate 11 and surfaces of the internal electrodes 12A and 12B, each of which is inwardly oriented toward a corresponding one of the first through hole 14, the second through hole 15, and the third through hole 16.

Subsequently, the insulation film formed on the internal electrode 12A and the internal electrode 12B is removed again using dry etching, wet etching or the like, and a metal thin film is subsequently formed on the entire back surface of the semiconductor substrate 11 and inner walls of the first through hole 14, the second through hole 15, and the third through hole 16 by sputtering. Here, Ti, TiW, Cr, Cu, or the like is mainly used for the metal thin film.

Figure 7:
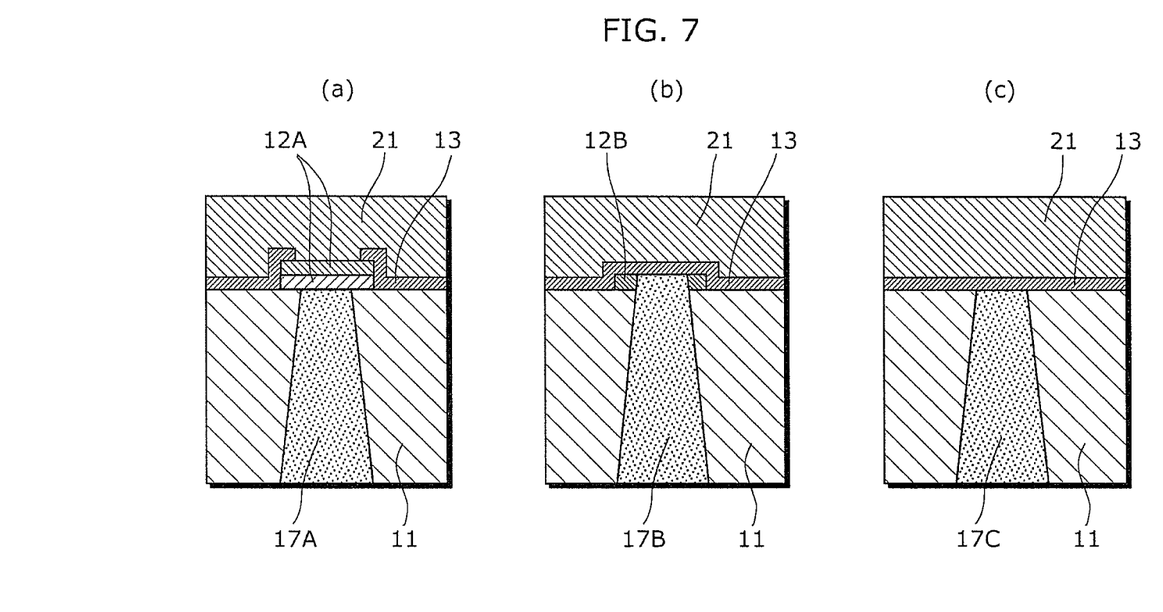

Subsequently, the first through electrode 17A, the second through electrode 17B, and the third through electrode 17C are provided by: according to a print-fill method using conductive paste, an electrolytic plating method, or the like, filling the first through hole 14, the second through hole 15, and the third through hole 16 with a metal material, or forming the metal material in a film state on the inner walls of the first through hole 14, the second through hole 15, and the third through hole 15.

FIG. 7(a) to (c) is an enlarged cross-sectional view showing a configuration of the main part of the semiconductor device 10 at the end of Process 4. FIG. 7(a) to (c) corresponds to the portion shown in FIG. 3(a) to (c), each showing an example of a state in which each of the first through electrode 17A, the second through electrode 17B, and the third through electrode 17C is formed.

(Process 5) From the surface side of the semiconductor substrate 11, for example, by observation using a microscope, appearance check (appearance inspection, size measurement, and so on) is performed on the second through electrode 17B that appears on the surface of the internal electrode 12B, and the third through electrode 17C that appears on the surface of the semiconductor substrate 11.

As a result of the appearance check, when the second through electrode 17B and the third through electrode 17C are not formed into a desired shape, rework processing is performed (not shown in FIG. 4) or the subsequent process is terminated, based on an estimation that the first through electrode 17A is not properly formed accordingly. This allows reducing production loss.

In addiction, the result of the appearance check may be immediately fed back to the conditions for manufacturing the through hole in the subsequent substrate or lot. This allows improving the quality of the through hole and increasing the manufacturing yield.

(Process 6) Subsequently, a plurality of metal wirings 18 that is to connect each the first through electrode 17A, the second through electrode 17B, and the third through electrode 17C are formed, using a photolithography technique, electrolytic plating, and wet etching.

Specifically, after applying a photosensitive liquid resist by spin coating or attaching dry film across the entire back surface of the semiconductor substrate 11, the resist is patterned to mach the metal wiring 18 by exposure and development.

Note that the thickness of the resist may be determined according to the thickness of the metal wiring 18 desired to be ultimately formed, but the thickness is generally 5 μm to 30 μm. Then, the metal wiring 18 is formed, using electrolytic plating, at an aperture provided in the resist, and subsequently the resist is removed, and cleaning is performed.

Subsequently, the metal wiring 18 is formed by removing the metal thin film by wet etching, which is previously formed by sputtering at the time of forming the first through electrode 17A, the second through electrode 17B, and the third through electrode 17C. Here, the resist and the dry film may be either negative or positive. In addition, for electrolytic plating, Cu plating is mainly used. In addition, in wet etching of the metal thin film, hydrogen peroxide is mainly used when the metal thin film is formed primarily of Ti, and ferric chloride is mainly used when the metal thin film is formed primarily of Cu.

Note that additive formation using electrolytic plating has been described here, but another formation method may be adopted that is to perform, after electrolytic Cu plating on the entire back surface of the semiconductor substrate 11, perform formation by resist formation and wet etching.

Note that it is preferable to form the first through electrode 17A, the second through electrode 17B, the third through electrode 17C, and the metal wiring 18 by electrolytic plating at the same time because this allows reducing the number of processes. In this case, the process order of the appearance check on the second through electrode 17B and the third through electrode 17C is changed to be after forming of the metal wiring 18.

(Process 7) On the back surface of the semiconductor substrate 11, the insulation layer 19 is formed to cover the metal wiring 18. Generally, the insulation layer 19 is formed using a photosensitive resin, by spin coating or attaching dry film.

Subsequently, by selectively removing the insulation layer 19, using a photolithography technique (exposure and development), the aperture for exposing a portion of the metal wiring 18 is formed.

Subsequently, in the aperture, an external electrode 20 to be electrically connected to the metal wiring 18 is formed by solder ball placement or solder paste printing using flux, or electrolytic plating. The external electrode 20 is formed using, for example, a lead-free solder material having a Sn—Ag—Cu composition.

(Process 8) Lastly, the semiconductor substrate 11 and the insulation layer 18 are cut into a plurality of singulated solid-state imaging devices 10, using a cutting tool, for example, a dicing saw.

Note that, although not described above, a support substrate that reinforces the wafer may be attached to the top surface side of the semiconductor substrate 11, and may be removed in the middle of the processing (for example, after forming the external electrode 20). In addition, an element that is to be structurally left as the transparent substrate 22 in the final state may be previously attached to the surface side of the semiconductor substrate 11 via the adhesive layer 21.

As described above, according to a method of processing the semiconductor substrate as part of the method of manufacturing the semiconductor device according to an embodiment of the present invention, the through hole and the through electrode are provided of which the state and appearance after formation can be checked by appearance (appearance inspection, size measurement, and so on) from the surface side of the semiconductor substrate 11, thus making it possible to perform an appearance check on each of the through hole and the through electrode immediately after the processes of forming the through hole and the through electrode.

With this, it is possible to detect a failure by the appearance check in an earlier stage of manufacturing the semiconductor device, and to perform rework processing or terminate the subsequent process, thus allowing, as a result, reducing production loss.

In addition, by immediately feeding back the result of the appearance check to the conditions for manufacturing the subsequent semiconductor substrate or lot, it is possible to improve qualities of the through hole and the through electrode, and increase a manufacturing yield of the semiconductor device.

In addition, by forming the internal electrode 12B that is thinner than the internal electrode 12A, the first through hole 14 is formed to reach the back surface of the internal electrode 12A, and the second through hole 15 is formed to penetrate through the internal electrode 12B, so that it is not necessary to change the conditions for manufacturing the first through hole 14 and the second through hole 15, thus making it possible to form the first through hole 14 and the second through hole 15 at the same time. This allows increasing productivity by reducing the number of processes.

(Summary)

As described above, the semiconductor device 10 according to an embodiment of the present invention includes at least one of: the second through electrode 17B which penetrates through the semiconductor substrate 11 and the internal electrode 12B; and the third through electrode 17C which penetrates through the semiconductor substrate 11 to reach the portion which is part of the surface of the semiconductor substrate 11 and on which no internal electrode is provided.

In addition, the semiconductor substrate 10 includes the first through electrode 17A which penetrates through the semiconductor substrate 11 to reach the back surface of the internal electrode 12A. In practice, the internal electrode 12A and the first through electrode 17A are used to electrically connect the inside and outside of the semiconductor device 10.

In such a configuration, although the first through hole 14 and the first through electrode 17A are hidden behind the internal electrode 12A and therefore cannot be checked by appearance (appearance inspection, size measurement, and so on) from the surface side of the semiconductor substrate 11, the second through hole 15, the third through hole 16, the second through electrode 17B, and the third through electrode 17C can be easily checked from the surface side of the semiconductor substrate 11.

Thus, by checking, in the middle of the manufacturing processing, for example, immediately after the process of forming the through hole, the state and appearance of the finished second through hole 15 and third through hole 16 by appearance check, it is possible to estimate the state and appearance of the formed first through hole 14 from the result of the appearance check. In addition, by checking, for example, immediately after the process of forming the through electrode, the state and appearance of the formed second through electrode 17B and third through electrode 17C by appearance check, it is possible to estimate the state and appearance of the formed first through electrode 17A from the result of the appearance check.

Then, when the state and appearance after formation is estimated to be not satisfactory, it is possible to reduce production loss by process control, such as performing rework processing or terminating the subsequent process. In addition, by immediately feeding back the result of the appearance check to the conditions for manufacturing the subsequent substrate or lot, it is possible to improve qualities of the through hole and the through electrode, and increase a manufacturing yield of the semiconductor device.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The semiconductor device according to an implementation of the present invention is particularly appropriate for an optical device (including a solid-state imaging device, and other various types of semiconductor devices and modules such as a photodiode and a laser module, and is further applicable to other various types of semiconductor devices including LSI, memory, a vertical device (a diode, a transistor, and so on), and an interposer.

What is claimed is:

1. A semiconductor device comprising:
    a substrate;
    a first internal electrode and a second internal electrode that are provided on a first main surface of said substrate;
    a first through electrode penetrating through said substrate in a thickness direction and electrically connected to said first internal electrode; and
    a second through electrode electrically connected to said second internal electrode,
    wherein said second internal electrode is thinner than said first internal electrode,
    each of said first internal electrode and said second internal electrode is in contact with said first main surface of said substrate,
    said second through electrode has a top surface which is higher than a top surface of said first through electrode, and
    said second through electrode penetrates through said second internal electrode.

2. The semiconductor device according to claim 1,
    wherein said first internal electrode is formed of a plurality of metal films that are laminated, and said second internal electrode is formed of a single metal film.

3. The semiconductor device according to claim 1,
    wherein said second internal electrode is not electrically connected to said substrate.

4. The semiconductor device according to claim 1, further comprising
    a function circuit formed on the first main surface of said substrate,
    wherein said second internal electrode is not electrically connected to said function circuit.

5. The semiconductor device according to claim 1, further comprising
    a passivation film covering said second internal electrode.

6. The semiconductor device according to claim 1, further comprising:
    a wiring provided on a second main surface and electrically connected to said first through electrode, the second main surface being opposite to the first main surface of said substrate; and
    an insulation layer covering the second main surface excluding a portion of said wiring.

7. The semiconductor device according to claim 6, further comprising
    an external electrode provided on the portion of said wiring that is not covered by said insulation layer, and electrically connected to said wiring.

8. An electronic device comprising
    the semiconductor device according to claim 7, said semiconductor device having said wiring or said external electrode connected to a wiring provided on a circuit board.

9. The semiconductor device according to claim 1, further comprising a passivation film provided on said first main surface of said substrate,
    wherein a top surface of said first internal electrode is exposed from said passivation film.

10. The semiconductor device according to claim 1, further comprising a passivation film provided on said first main surface of said substrate,
    wherein a thickness of said first internal electrode is greater than a thickness of said passivation film.

11. The semiconductor device according to claim 1, further comprising a transparent substrate formed on said first main surface of said substrate.

12. The semiconductor device according to claim 1, wherein the substrate includes a semiconductor.

13. A semiconductor device comprising:
    a substrate;
    a first internal electrode and a second internal electrode that are provided on a first main surface of said substrate;
    a first through electrode penetrating through said substrate in a thickness direction and electrically connected to said first internal electrode;
    a second through electrode electrically connected to said second internal electrode; and
    a third through electrode penetrating through said substrate in the thickness direction and not electrically connecting to any internal electrode,
    wherein said second internal electrode is thinner than said first internal electrode,
    each of said first internal electrode and said second internal electrode is in contact with said first main surface of said substrate, and
    said second through electrode has a top surface which is higher than a top surface of said first through electrode.

14. The semiconductor device according to claim 13,
    wherein said third through electrode is not electrically connected to said substrate.

15. The semiconductor device according to claim 13, further comprising
    a function circuit formed on the first main surface of said substrate,
    wherein said third through electrode is not electrically connected to said function circuit.

16. The semiconductor device according to claim 13, further comprising
    a passivation film provided on said first main surface of said substrate,
    wherein said passivation film covers a portion that said third through electrode reaches.

17. A semiconductor device comprising:
    a substrate;
    a first internal electrode and a second internal electrode that are provided on a first main surface of said substrate;
    a first through electrode penetrating through said substrate in a thickness direction and electrically connected to said first internal electrode;
    a second through electrode electrically connected to said second internal electrode; and
    a passivation film provided on said first main surface of said substrate,
    wherein said second internal electrode is thinner than said first internal electrode,
    said second through electrode penetrates through said second internal electrode,
    a top surface of said second through electrode is exposed from said second internal electrode, and
    said top surface of said second through electrode is connected to said passivation film.

18. The semiconductor device according to claim 17,
    wherein said first internal electrode is formed of a plurality of metal films that are laminated, and said second internal electrode is formed of a single metal film.

19. The semiconductor device according to claim 17, further comprising
a third through electrode penetrating through said substrate in the thickness direction and not electrically connecting to any internal electrode.

20. The semiconductor device according to claim 17, wherein
a thickness of said first internal electrode is greater than a thickness of said passivation film.

21. The semiconductor device according to claim 17, further comprising a transparent substrate formed on said first main surface of said substrate.

22. A semiconductor device comprising:
a substrate;
a first internal electrode and a second internal electrode that are provided on a first main surface of said substrate;
a first through electrode penetrating through said substrate in a thickness direction and electrically connected to said first internal electrode;
a second through electrode electrically connected to said second internal electrode; and
a third through electrode penetrating through said substrate in the thickness direction and not electrically connecting to any internal electrode,
wherein said second internal electrode is thinner than said first internal electrode,
the first internal electrode has a substantially constant thickness, and
the second internal electrode has a substantially constant thickness.

23. The semiconductor device according to claim 22, further comprising a passivation film provided on said first main surface of said substrate,
wherein a thickness of said first internal electrode is greater than a thickness of said passivation film.

24. The semiconductor device according to claim 22, further comprising a transparent substrate formed on said first main surface of said substrate.

* * * * *